(12) United States Patent
Johansson

(10) Patent No.: US 6,483,170 B2
(45) Date of Patent: Nov. 19, 2002

(54) RF POWER TRANSISTOR

(75) Inventor: Ted Johansson, Djursholm (SE)

(73) Assignee: Telefonaktiebolaget LM Ericsson, Stockholm (SE)

(*) Notice: Subject to any disclaimer, the term of this patent is extended or adjusted under 35 U.S.C. 154(b) by 0 days.

(21) Appl. No.: 09/975,519

(22) Filed: Oct. 10, 2001

(65) Prior Publication Data

US 2002/0036325 A1 Mar. 28, 2002

Related U.S. Application Data

(62) Division of application No. 09/572,339, filed on May 16, 2000, now Pat. No. 6,340,618.

(51) Int. Cl.[7] .................. H01L 27/82; H01L 27/102; H01L 29/70; H01L 31/11
(52) U.S. Cl. ........................ 257/580; 257/578
(58) Field of Search .................. 257/539, 578, 257/580, 581, 582, 273, 591, 592

(56) References Cited

U.S. PATENT DOCUMENTS

| | | | | |
|---|---|---|---|---|
| 3,597,640 A | | 8/1971 | Kubinec | 307/303 |
| 4,801,867 A | | 1/1989 | Suzuki | 324/73 R |
| 5,329,156 A | * | 7/1994 | Bartlow | 257/579 |
| 5,414,296 A | * | 5/1995 | Bartlow | 257/579 |
| 5,684,326 A | * | 11/1997 | Johansson et al. | 257/582 |
| 5,821,620 A | | 10/1998 | Hong | 257/751 |

FOREIGN PATENT DOCUMENTS

EP 0810503 A1 * 3/1997
EP 0810503 A1 12/1997

OTHER PUBLICATIONS

H. F. Cooke, *Microwave Transistors: Theory and Design*, PROC.IEEE, vol. 59, pp. 1163–1181, Aug. 1971.
S. M. Sze, *Physics of Semiconductor Devices*, 2nd Ed., pp. 150–151, John Wiley & Sons, Inc., 1981.
R. Allison, *Silicon Bipolar Microwave Power Transistors*, IEEE Trans. Microwave Theory & Techniques, vol. MTT–27 No. 5, pp. 415–422, 1979.
Erlandsson, T.; International–Type Search Report; Search Request No. SE99/00616; App. No. SE9901771–7; Apr. 5, 2000, pp. 1–3.

* cited by examiner

Primary Examiner—Hoai Ho
Assistant Examiner—David Nhu
(74) Attorney, Agent, or Firm—Jenkens & Gilchrist, P.C.

(57) ABSTRACT

A method for manufacturing a silicon bipolar power high frequency transistor device is disclosed. A transistor device according to the present method is also disclosed. The transistor device assures conditions for maintaining a proper $BV_{CER}$ to avoid collector emitter breakdown during operation. According to the method an integrated resistor is arranged along at least one side of a silicon bipolar transistor on a semiconductor die which constitutes a substrate for the silicon bipolar transistor. The integrated resistor is connected between the base and emitter terminals of the silicon bipolar transistor. The added integrated resistor is a diffused $p^{+}$ resistor on said semiconductor die or a polysilicon or NiCr resistor placed on top of the isolation layers. In an interdigitated transistor structure provided with integrated emitter ballast resistors the added- resistor or resistors (20) will be manufactured in a step simultaneously as producing the ballast resistors.

5 Claims, 2 Drawing Sheets

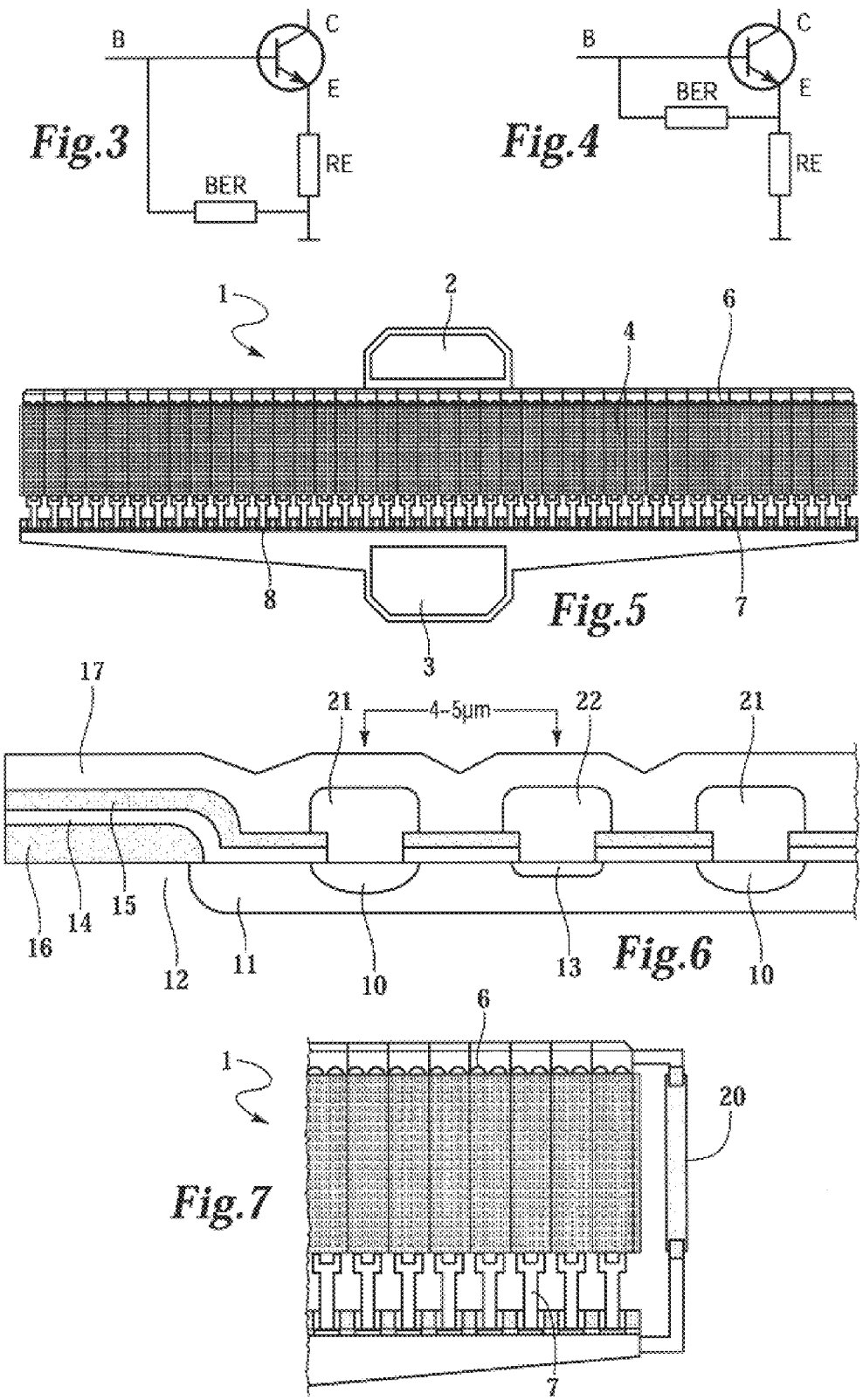

RF POWER TRANSISTOR

This application is a divisional of application Ser. No. 09/572,339, filed on May 16, 2000. now U.S. Pat. No. 6,340,618 B1 issued on Jan. 22, 2002. This application claims priority from Swedish Patent Application No. 9901771-7, filed May 17, 1999.

BACKGROUND

1. Field of the Invention

The inventions are related to silicon bipolar RF-power transistors, particularly discrete transistors using high voltage supply for use in cellular base stations, TV-transmitters etc.

2. Description of Related Art

Bipolar transistors for high-frequency power amplification are widely used in output parts of communications system. High-frequency transistors were first fabricated in germanium in late fifties but were soon replaced by silicon bipolar transistors in the beginning of the sixties, and have since then dominated the RF-power area. For cellular radio, bipolar transistors are dominating in the base station output amplifiers, and can deliver great performance up to at least 2 GHz and 100 W output power, with good stability, availability and price. Other technologies of choice for this class of applications are GaAs MESFETs and laterally diffused MOS-transistors (LD-MOS). There is a strong driving force to further improve the existing technology, as well as to explore new types of devices, because of the rapidly expanding telecommunications market. Computer tools presently available are not yet capable to predict detailed behavior or performance in real applications, and performance optimization is made using mainly experimental methods.

Power transistors are especially designed to deliver high output power and high gain. Manufacturing process, device parameters, layouts and package have been carefully tuned for this purpose. The devices need to meet numerous detailed requirements for breakdown voltages, DC gain or transconductance, capacitance, RF gain, ruggedness, noise figure, input/output impedance, distortion etc. The operating frequency range from several hundred MHz into the GHz region. Power transistors operate at large signal levels and high current densities. About 1 W output power is a starting level where special considerations have to be taken into account, and may serve as a loose definition of a power device, compared to a "normal", IC-type of transistor.

A bipolar transistor is usually designed using only one n-type (i.e. NPN) device on a single die. A collector layer ($n^-$ epi) is epitaxially deposited on an $n^+$ substrate. The base and emitter are formed by diffusion or ion implantation at the top of the epitaxial layer. By varying the doping profiles, it is possible to achieve different frequency and breakdown voltage characteristics. The output power requirements range up to several hundred watts, sometimes even kilowatts, and the high output power is achieved by paralleling many transistor cells on a single die, and paralleling several dies in a package. The packages often have large gold-plated heat sinks to remove heat generated by the chip.

For the DC-data, the $BV_{CEO}$ (collector-emitter breakdown voltage with open base) is the most limiting parameter, traditionally designed to be higher than $V_{CC}$ (24–28 V supply voltage is a common range for this class of devices). A well-known empirical formula for the relationship of the transistor breakdown voltages and the current gain, b or $h_{FE}$, states:

$$BV_{CEO} = \frac{Bv_{CBO}}{\sqrt[n]{\beta}} \quad (1)$$

where $BV_{CEO}$ already has been defined, $BV_{CBO}$ is the collector-base breakdown voltage with open emitter, and n is an empirical constant, usually between 2.5 and 4.5, related to the nature of the BC-junction breakdown. For a given epi doping and device design (constant n), $BV_{CBO}$ will be constant, and then $BV_{CEO}$ and $\beta$ are directly correlated: higher $\beta$ gives lower $BV_{CEO}$. n can be improved by different doping profile tricks, to ensure that nature of the $BV_{CBO}$ is as close as possible to the one-dimensional junction case.

To obtain a device capable of high output power, the doping of the collector layer should be selected as high as possible, thus suppressing high current phenomena, such as the Kirk effect. A highly doped collector layer also has the advantage of having a smaller depletion region, which makes it possible to select a thinner epi layer, with less parasitic resistance and better high-frequency performance, without being limited by thickness-limited breakdown. The problem is that increased collector doping inevitably leads to a low $BV_{CBO}$ and thus a low $BV_{CEO}$, according to equation (1).

To obtain a device capable of high power gain, the $\beta$ must not be too low. The power gain $G_p$ can be described by the following relationship:

$$G_p(f) \approx \frac{\beta}{\sqrt{1+\beta^2\left(\frac{f}{f_{\max}}\right)^4}} \quad (2)$$

where $\beta$ is the zero-frequency gain ($h_{FE}$) and $f_{max}$ is the maximum oscillation frequency, or the frequency where the power gain is equal to unity. A plot of equation (2), $h_{FE}$ versus $G_p$, is shown in FIG. 1 for different $f_{max}$ values at f=1 GHz. From this plot it can be concluded that a high $f_{max}$ and not too low $\beta$ are detrimental for a good RF power gain.

Because of the relations between output power via collector doping, power gain via $\beta$ and $BV_{CEO}$, if a low $BV_{CEO}$ can be accepted, this will lead to significant improvements of the most important parameters for RF power transistors.

Because of this, data sheets may specify $BV_{CER}$ instead of $BV_{CEO}$. A small resistor is connected between the base and emitter when designing the amplifier, to assure that the base is never fully open. If the resistor is small enough, $BV_{CER}$ will approach $BV_{CES}$, which is close (slightly lower) to $BV_{CBO}$. The characteristics for the different collector breakdown voltages are shown in FIG. 2.

As apparent from the previous section, if $BV_{CEO}$ is lower than $V_{CC}$, an external resistor, which occupies additional space on a circuit board, must be used to assure safe operation of the device. The value is dependent on the size of the device, and an optimal value may be problematic to find, and requires some experience to not destroy the device while finding the value. If, in any way, the resistor disconnects from the circuit, e.g. during evaluations, bad soldering etc., the transistor may be damaged.

SUMMARY

By integrating a resistor on the bipolar RF-power transistor semiconductor die, between base and emitter in accordance with the present invention, it will be assured that the conditions to obtain the $BV_{CER}$ always will be fulfilled.

Therefore, integrating the resistor necessary for $BV_{CER}$ into the semiconductor die results in that the use of transistors with an intrinsic low $BV_{CEO}$ is simplified.

A transistor device according to embodiments of the present invention is set forth herein.

BRIEF DESCRIPTION OF THE DRAWINGS

The invention, together with further objects and advantages thereof, may best be understood by making reference to the following description taken together with the accompanying drawings, in which:

FIG. 3 illustrates schematically a first possibility of an external or integrated BE-resistor;

FIG. 4 illustrates schematically a second possibility of a fully integrated BE-resistor; and FIG. 5 illustrates a typical RF-power transistor layout;

FIG. 6 is a cross section of the RF-power transistor shown in FIG. 5;

FIG. 7 illustrates in accordance with the present invention the adding of a BE-resistor into the layout according to FIG. 5.

DETAILED DESCRIPTION

Figure 1:
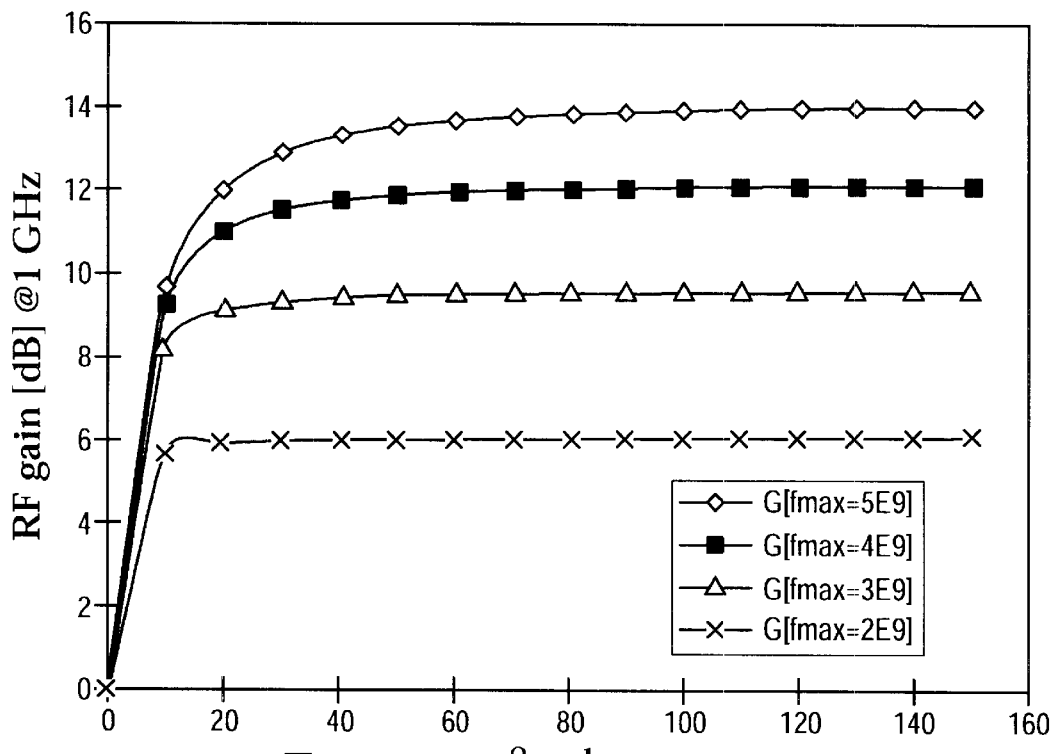
FIG. 1 illustrates the power (RF) gain at 1 GHz as a function of the DC gain $h_{FE}$ and $f_{max}$.
Figure 2:
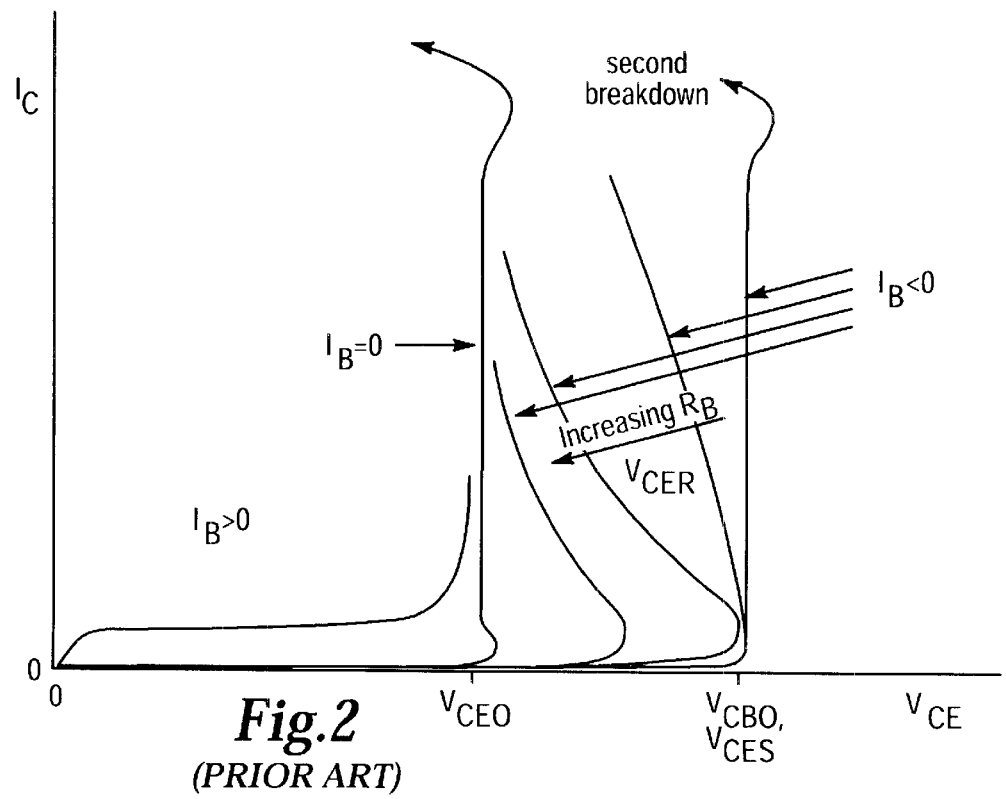
FIG. 2 illustrates characteristics for the different collector breakdown voltages.

A typical bipolar transistor layout is shown in FIG. 5. The transistor structure is vertical with the collector contact on the silicon substrate's backside. The cross-section of the upper part of the structure is shown in FIG. 6.

The majority of modern RF bipolar power transistors of today contain a large number of paralleled transistor segments to obtain a high power capacity by distributing a large amount of current, reducing parasitics and providing heat spreading. The most common layout scheme, the interdigitated layout, consists of alternating fingers of base and emitter regions in parallel, connected by ribbons of metalization on top of the silicon. A typical transistor cell layout with an active area 4 is demonstrated in FIG. 5. Reference number 2 indicates a base terminal bonding pad and 3 indicates the emitter terminal bonding pad while as already noted the backside of the substrate forms the collector terminal pad.

If the bias supply of a transistor is held constant and temperature increases, then $V_{be}$ decreases and collector current increases. If there is no other influence, this condition may cause the transistor to go into "thermal run away" wherein a current is reached at which the transistor fails. One method to avoid this is to use a resistor in series with the emitter. As collector current increases, $V_{be}$ is reduced, therefore, the base current is reduced. The best place to locate this emitter resistor is on the silicon chip together with each active transistor in the array. In this manner the inductance in series with the emitter resistor is kept to a minimum. This emitter resistor is mostly referred to as the ballast resistor. In the array of FIG. 5 the ballasting in noted by reference number 8.

FIG. 6 illustrates a more detailed schematic cross section of a typical interdigitated cell of FIG. 5. Reference number 11 refers to a p-type base layer on top of an ⁻epi substrate material 12. In the base region material is seen an $n^+$ doped emitter area 13 and two $p^+$ doped base contact areas 10. The base contact areas 10 are further contacted by metalizations 21 and the emitter contact area 13 is further contacted by a metalization 22. Pairs of the emitter metalizations are then combined by the forked terminal fingers 7 illustrated in FIG. 5. The metalized fingers 7 are connected via ballast resistors 8, to the emitter terminal bonding pad 3. Correspondingly the base metalizations are combined for connecting to the base terminal bonding pad 2 at the upper portion of the structure according to FIG. 5. In the structure according to the cross section of FIG. 6 is also seen oxide layers 15 and 16 and a nitride layer 14 as well as a nitride passivation layer 17. FIGS. 5 and 6 demonstrate the use of a common silicon planar technology. In a typical 1 GHz technology the pitch defined as the emitter-to-base periodic distance is of the order 4–5 mm and the emitter and base openings are typically 1 to 1.5 mm wide. A silicide, e.g. PtSi, is often used in the emitter and base openings to lower the contact resistance and thus the parasitic base resistance. To further ensure a good diffusion barrier between metal and semiconductor material a multi-layered TiW/TiW(N)/TiW barrier may be used in accordance to the metalization scheme for microcircuit interconnections disclosed in our U.S. Pat. No. 5,821,620, which is hereby incorporated by reference. There is no inter-device isolation and the whole silicon substrate constitutes the collector.

By integrating a further resistor on the bipolar RF-power transistor semiconductor die, between base and emitter, it will be assured that the conditions to obtain the proper $BV_{CER}$ always will be fulfilled.

FIGS. 3 and 4 show the circuit diagram for the semiconductor die with integrated $R_{BE}$, indicating two different possibilities, where circuitry of FIG. 3 will correspond to the preferred solution today with an external resistor.

An example how to add the BE-resistor 20 is demonstrated in FIG. 7. The resistor is connected to the base and emitter metalization, at least on one side, but preferably on both sides of the array structure (left and right side in FIG. 5). The embodiment of FIG. 7 represents the circuit of FIG. 3.

An example how to add the BE-resistor 20 is demonstrated in FIG. 7. The resistor 20 is connected to the base and emitter metalization, at least on one side, but preferably on both sides of the array structure (left and right side in FIG. 5). The embodiment of FIG. 7 represents the circuit of FIG. 3.

An integrated resistor on a semiconductor die can be formed using several different methods. The three most common are diffused resistors, polysilicon resistor and metal resistors, e.g. NiCr. Integration of distributed resistors between the active emitter areas and the emitter connection (emitter pad) is necessary for high voltage device operation, emitter ballasting as previously mentioned. Integration of other passive elements, such as capacitors, is also known.

The actual BE-resistor is formed by any of the above mentioned methods (diffused, poly, NiCr), but preferably using the same method as the compulsory emitter ballasting resistor. The resistor value will conveniently be selected by the size of the resistor area (size of the square between the terminals) and the doping. It is possible to use the same doping steps as for the ballasting resistor, which is ion-implanted with an adjustable dose, and usually with a mask, which is open only over resistor areas. However, as the ballasting resistor usually requires adjustments during the development phase for a new transistor or new applications, an additional mask for independently selecting the doping level for the BE-resistor (in combination with the layout) is beneficial for engineering purposes.

There will also be a tighter, quite advanced way to realize the BE-resistor within the transistor structure, at least for a transistor using polysilicon for emitter and base contacts, the resistor then also being polysilicon. In that case, the resistor will be connected corresponding to FIG. 4, but care must be taken for not degrading the effect of the RE-ballasting.

When the added BE resistor is diffused p⁺ on the n⁻ collector epi, it must be assured that the base/emitter voltage is always lower than the collector voltage, but this is normally the case. When applying polysilicon or NiCr resistors those are placed on top of the isolation layers 15, 16 (left part of FIG. 6), so any voltage relative the collector substrate can be used. These resistors are also beneficial, because the important BC-capacitance is lower than for a diffused resistor.

A typical value for the BE-resistor for the layout used in this example is 10Ω.

One slight drawback with the solution is that it increases the base-emitter bias current, which will affect the efficiency, e.g. collector efficiency defined as a $\eta = P_{RF,out}/P_{DC,in}$. The increase is quite small and the devices used in the typical application field are not especially demanding on the efficiency requirements, compared to e.g. devices for low-voltage handheld applications.

However, the important benefit is the general protection obtained by the integrated BE resistor, which is always present to assure conditions for maintaining a proper value of $BV_{CER}$ to avoid collector to emitter breakdown.

In a further embodiment of the present invention utilizing integrated BE resistors in the interdigitated structure, the individual emitter ballast resistors are further provided with a bypass capacitor on the chip for increasing the gain of the RF power transistor.

It will be understood by those skilled in the art that various modifications and changes may be made to the present invention without departure from the scope thereof, which is defined by the appended claims.

What is claimed is:

1. A power transistor device comprising:

an integrated resistor along at least one side of a silicon bipolar transistor in a semiconductor die comprising a substrate for said silicon bipolar transistor; and wherein said integrated resistor is connected between base and emitter terminals of said silicon bipolar transistor, the integrated resistor being adapted to maintain a proper $BV_{CER}$ to avoid collector emitter breakdown.

2. The power transistor device of claim 1, wherein said integrated resistor comprises:

a diffused p⁺ resistor on said semiconductor die; and wherein a base/emitter voltage is always lower than a collector voltage.

3. The power transistor device of claim 1, wherein said integrated resistor comprises a resistor selected from the group consisting of polysilicon and NiCr resistors, the resistor being positioned on top of isolation layers.

4. The power transistor device of claim 1, wherein the silicon bipolar transistor comprises an RF power transistor, the RF power transistor comprising an interdigitated structure provided with a plurality of integrated emitter ballast resistors adapted to prevent thermal run away.

5. The power transistor device of claim 4, wherein said RF power transistor is provided with an integrated bypass capacitor for each integrated emitter ballast resistor, said integrated bypass capacitor being adapted to increase the gain of said RF power transistor.

* * * * *